(12) United States Patent
Ettridge et al.

(10) Patent No.: US 10,549,510 B2
(45) Date of Patent: Feb. 4, 2020

(54) FLEXIBLE MULTILAYER PACKAGING FILM WITH ULTRA-HIGH BARRIER PROPERTIES

(71) Applicant: Amcor Flexibles Kreuzlingen AG, Kreuzlingen (CH)

(72) Inventors: Peter Ettridge, Worcester (GB); Roy Christopherson, Swindon (GB); Isabel Broeckhove, Lochristi (BE); Wolfgang Lohwasser, Gailingen (DE); Steffan Skov Jensen, Hedensted (DK)

(73) Assignee: Amcor Flexibles Kreuzlingen AG, Kreuzlingen (CH)

( * ) Notice: Subject to any disclaimer, the term of this patent is extended or adjusted under 35 U.S.C. 154(b) by 81 days.

(21) Appl. No.: 15/737,947

(22) PCT Filed: Jun. 30, 2016

(86) PCT No.: PCT/EP2016/065306
§ 371 (c)(1),
(2) Date: Dec. 19, 2017

(87) PCT Pub. No.: WO2017/005597
PCT Pub. Date: Jan. 12, 2017

(65) Prior Publication Data
US 2018/0170017 A1    Jun. 21, 2018

(30) Foreign Application Priority Data
Jul. 3, 2015    (EP) .................................... 15175241

(51) Int. Cl.
*B32B 27/08*    (2006.01)
*B32B 27/02*    (2006.01)
(Continued)

(52) U.S. Cl.
CPC ................ *B32B 27/08* (2013.01); *B32B 7/12* (2013.01); *B32B 27/16* (2013.01); *B32B 27/32* (2013.01);
(Continued)

(58) Field of Classification Search
None
See application file for complete search history.

(56) References Cited

U.S. PATENT DOCUMENTS 5,112,673 A    5/1992    Sawada et al.
5,153,074 A  *  10/1992  Migliorini ............... B32B 27/32
                                                    428/463
(Continued)

FOREIGN PATENT DOCUMENTS

EP           0794266 A1    6/1996
EP           0958399 A1   11/1999
WO       WO 97/37054 A1   10/1997

*Primary Examiner* — Tae H Yoon
(74) *Attorney, Agent, or Firm* — Reinhart Boerner Van Deuren P.C.

(57) ABSTRACT

The present invention is related to a flexible multilayer packaging film with high gas barrier properties comprising:
one or more support layer(s) (1,10);
one or more barrier layer(s) (6,60), each of the one or more barrier layer(s) (6,60) comprising an organic layer (2,20) and an inorganic layer (3,30); wherein said multilayer film has an oxygen transmission rate of less than 0.1 $cm^3/m^2/24$ h/atm, preferably less than 0.05 $cm^3/m^2/24$ h/atm, most preferably less than 0.03 $cm^3/m^2/24$ h/atm measured at 23° C. and 50% relative humidity.

24 Claims, 3 Drawing Sheets

Figure 1A:
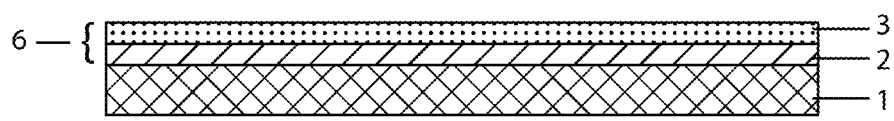

(51) Int. Cl.
  *B32B 27/32* (2006.01)
  *B32B 27/36* (2006.01)
  *C23C 14/20* (2006.01)
  *B32B 27/16* (2006.01)
  *B32B 7/12* (2006.01)
  *B32B 37/12* (2006.01)
  *B32B 37/18* (2006.01)
  *B32B 38/00* (2006.01)
  *C23C 14/22* (2006.01)

(52) U.S. Cl.
  CPC .............. *B32B 27/36* (2013.01); *B32B 37/12* (2013.01); *B32B 37/182* (2013.01); *B32B 38/0008* (2013.01); *C23C 14/20* (2013.01); *C23C 14/221* (2013.01); *B32B 2250/24* (2013.01); *B32B 2255/10* (2013.01); *B32B 2255/20* (2013.01); *B32B 2255/205* (2013.01); *B32B 2255/26* (2013.01); *B32B 2307/7244* (2013.01); *B32B 2323/04* (2013.01); *B32B 2323/10* (2013.01); *B32B 2367/00* (2013.01); *B32B 2553/00* (2013.01)

(56) References Cited

U.S. PATENT DOCUMENTS

| | | | |
|---|---|---|---|
| 5,491,023 A * | 2/1996 | Tsai | B32B 27/08 428/349 |
| 5,688,556 A | 11/1997 | Wagner, Jr. | |
| 7,252,878 B2 | 8/2007 | Watanabe et al. | |
| 8,945,702 B2 * | 2/2015 | Wuest | B32B 27/28 428/200 |
| 2004/0131868 A1 | 7/2004 | Watanabe et al. | |
| 2009/0149593 A1 * | 6/2009 | Funabiki | C08L 23/0861 524/442 |

\* cited by examiner

FLEXIBLE MULTILAYER PACKAGING FILM WITH ULTRA-HIGH BARRIER PROPERTIES

FIELD OF THE INVENTION

The present invention is related to a flexible multilayer packaging film with high barrier properties, in particular, extremely, ultra-high barrier properties to oxygen transmission. The present invention is also related to the method for the production of such flexible multilayer packaging films.

STATE OF THE ART

Flexible high barrier multi-layer films for packaging applications are well known by those skilled in the art and have many applications in the packaging industry. Non imitative examples are food packaging, home and personal care packaging, pharmaceutical and medical packaging, non-food encapsulation, etc.

The easiest and most classical way to obtain flexible high barrier packaging films is the use of an integrated aluminium layer of at least 5 μm, preferably more than 12 μm thickness. Aluminium is nevertheless expensive, of high density, subject to pinholes at lower thicknesses after flexing and has the drawback of opacity. Aluminium is also known to cause problems for heating a packed food product in a microwave oven without using ovenware. Moreover, the presence of a metal layer in general is undesirable in terms of recycling possibilities and metal detection with the packaging process.

The retention of barrier properties for laminates containing thin aluminium foils is an outstanding problem as flexing typically generates pinholes, reducing the barrier properties of the laminate. In the present invention the favour is therefore given to aluminium-free (or, more in general, metal-free) laminates, or at least to laminates with strongly reduced aluminium (or strongly reduced metal) layer thicknesses.

In the art, other solutions have been imagined, such as the application of a Very thick ceramic layer generally based on amorphous SiOx and AlOx compositions. Those solutions have the drawback of being sensitive to mechanical stresses and also often lose the major part of their barrier properties after flexing, hard creasing and folding the film.

In the art, there is thus an issue in providing high barrier properties with thin film materials in applications where flexing, hard creasing and folding are employed.

Moreover, high speed manufacturing of transparent high barrier materials using transparent oxide coatings with oxygen transmission rates lower than 0.01 $cm^3/m^2/24$ h/atm is not possible with currently available commercial scale technologies. Laminates using multiple layers of barrier films are typically used in the art to achieve high levels of barrier with transparent substrates.

Other known solutions are focussed on polymer webs integrating EVOH associated to SiOx or to AlOx. Such solutions are for example disclosed in U.S. Pat. No. 5,688,556 (or corresponding EP 0958399). Therein, a method of producing a multilayer polymeric film is disclosed through the vapour deposition of a barrier coating onto an ethylene vinyl alcohol (EVOH) copolymer layer, which is adhered to a polymeric substrate. The EVOH layer is generally coextruded to the polymeric substrate. The coated films are reported to exhibit an oxygen transmission rate between 1.09 to 6.51 $cm^3/m^2/atm/24$ hr at 23° C. and 0% relative humidity (R.H.). The reached oxygen transmission values of this disclosure are thus still very high.

U.S. Pat. No. 7,252,878 B2 discloses a metallic film coated with EVOH as high gas barrier film. It is described that by applying an EVOH layer directly onto a metallized layer which in turn is deposited on a BOPP layer provides exceptionally good barrier properties in a multilayer BOPP film. The configuration of EVOH on the metallized aluminum layer provides a synergistic high barrier for the extrusion coated flexible structure, i.e. the resultant flexible packaging structure provides an excellent barrier for moisture, oxygen and aroma protection. The complete multilayer flexible packaging structure, either extrusion coated or extrusion laminated, could be used for packaging food products or other industrial applications with excellent shelf-life or barrier protection. The oxygen transmission rate of the laminate film was measured by using a Mocon Oxtran 2/20 unit substantially in accordance with ASTM D3985. The preferred OTR value is an average value equal to or less than 0.5 $cm^3/m^2/day$, preferably less than 0.35 $cm^3/m^2/day$, more preferably less than 0.2 $cm^3/m^2/day$.

U.S. Pat. No. 5,112,673 A discloses a combination of PVOH (polyvinyl alcohol) with SiOx in a high gas barrier packaging film. It relates to a plastic film having high moisture barrier. More specifically, it relates to a film of high moisture barrier which is transparent, substantially impermeable to gases such as water vapor, and well-suited for packaging films for electroluminescence (EL) elements that are used for back lights in liquid crystal displays. It is disclosed that a film comprising a specific polyvinyl alcohol film provided thereon with a silicon oxide thin film has an improved transparency and moisture barrier, and can maintain its moisture barrier in a high temperature and humidity atmosphere over an extended period of time by protecting it with another transparent plastic film provided thereon with a silicon oxide thin film. It discloses a laminated structure comprising a silicon oxide core layer and a protective layer joined to one side of the core layer, wherein (a) the core layer is composed of a transparent film of a polyvinyl alcohol having a degree of saponification of 99 mol % or higher, the film having a silicon oxide thin film formed on at least one side thereof; and (b) the protective layer is composed of a transparent film including at least one layer of a transparent plastic film having a transparent silicon oxide thin film formed on at least one side thereof. A sealant layer of a sealable resin could be joined to the other side of the core layer. The achieved values of moisture permeability of this disclosure are reported to be low, however, no oxygen transmission barrier values are investigated nor discussed.

Aims of the Invention

The present invention aims to provide a flexible multilayer packaging film with high barrier properties, in particular extremely, ultra-high barrier properties exhibiting oxygen transmission rates lower than 0.05, preferably lower than 0.01 $cm^3/m^2/24$ h/atm (at 23° C. and 50% relative humidity).

The present invention further aims to provide ultra-high barrier films against oxygen transmission, said films being able to maintain its properties even after submission of a laminate of the film to mechanical constraints such as folding or flexing, in particular, after submission to a normalised Gelbo flex test.

In the present invention, it is envisaged to provide such flexible multilayer packaging films with high barrier properties, in particular extremely, ultra-high barrier properties, the films being aluminium-free (or, more in general, metal-free), or at least comprising only strongly reduced aluminium (or strongly reduced metal) layer thicknesses, when compared to packaging films obtained by methods described in the art.

Further aspects of the present invention envisage providing the method for producing such flexible multilayer packaging films.

SUMMARY OF THE INVENTION

The present invention discloses a flexible multilayer packaging film with high gas barrier properties comprising:
- one or more support layer(s) (1,10);
- one or more barrier layer(s) (6,60), each of the one or more barrier layer(s) (6,60) comprising (or consisting of) an organic layer (2,20) and an inorganic layer (3,30);

wherein a laminate of said multilayer film has an oxygen transmission rate of less than 0.1 cm$^3$/m$^2$/24 h/atm, preferably less than 0.05 cm$^3$/m$^2$/24 h/atm, most preferably less than 0.03 cm$^3$/m$^2$/24 h/atm measured at 23° C. and 50% relative humidity.

Preferred embodiments of the present invention disclose at least one, or an appropriate combination of the following features:
- the oxygen transmission rate of a laminate of said multilayer film does not increase more than 30%, preferably not more than 20%, most preferably not more than 10% after having been submitted to a Gelbo Flex mechanical constraint test according to ASTM F392-74 standard;
- the one or more barrier layer(s) is (are) sandwiched between a (or one) additional sealant layer (5) and the one or more support layer(s) (1,10);
- the organic layer of the one or more barrier layer(s) is polyvinyl alcohol, in particular ethylene vinyl alcohol copolymer comprising between 25 to 50 mol % alcohol, preferably between 27 to 45 mol % of alcohol;
- the one or more support layer(s) is (are) selected from the group consisting of oriented polypropylene, oriented polyester, oriented polyamide, oriented polylactic acid, as well as copolymers of those polymers, paper and carton;
- the sealant layer has a thickness of at least 10 µm and is selected from the group consisting of polyethylene, polypropylene and amorphous polyester, as well as copolymers of those polymers;
- the inorganic layer of the one or more barrier layer(s) is AlOx or SiOx, preferably SiOx;
- the x in SiOx is comprised between 1 and 2, preferably between 1.5 and 1.8 ; and wherein AlOx has the formula AlyOz, the ratio y/z being a number from 0.2 to 1.5, preferably y being 2 and z being 3;
- the inorganic layer has a thickness between 20 and 120 nm, preferably between 30 and 100 nm, most preferably between 40 and 80 nm;
- the one or more barrier layer(s) comprise(s) an aluminium layer having a thickness comprised between 5 µm and 50 µm, preferably between 5 µm and 25 µm, most preferably between 5 µm and 15 µm.

The present invention further discloses a method for the production of (or a method for producing) the flexible multilayer packaging film according to the invention comprising the steps of:
- providing one or more support layer(s) (1,10);
- applying the organic layer (2,20) or the inorganic layer (3,30) of the one or more barrier layer(s) (6,60) on the one or more support layer(s) (1,10).

Preferred embodiments of the method of the present invention disclose at least one, or an appropriate combination of the following features:
- applying an (or one) additional sealant layer (5) on the one or more applied barrier layer(s) (6,60);
- providing at least a first and a second support layer (1,10); applying the organic layer (2) of the first barrier layer (6) on the first support layer (1) and the inorganic layer (30) of the second barrier layer (60) on the second support layer (10); or applying the inorganic layer (3) of the first barrier layer (6) on the first support layer (1) and applying the organic layer (20) of the second barrier layer (60) on the second support layer (10);
- applying a (or one) additional sealant layer (5) on the applied second barrier layer (60);
- the inorganic layer is applied by electron beam vacuum deposition;
- the inorganic layer is applied by electron beam vacuum deposition at a pressure lower than 10-3 mbar with an applied voltage of 5 to 40 kV;
- the inorganic layer of the one or more barrier layer(s) is applied on the surface of the organic layer of the one or more barrier layer(s), or the organic layer of the one or more barrier layer(s) is applied on the surface of the inorganic layer of the one or more barrier layer(s), preferably the inorganic layer of the one or more barrier layer(s) is applied on the surface of the organic layer of the one or more barrier layer(s), and wherein the organic layer is a polyvinyl alcohol layer, in particular an ethylene vinyl alcohol copolymer comprising between 25 to 50 mol % alcohol, preferably between 27 to 45 mol % of alcohol;
- the inorganic layer (3) of the first barrier layer (6) is applied on the surface of the organic layer (2) of said first barrier layer (6) and the organic layer (20) of the second barrier layer (60) is applied on the surface of the inorganic layer (30) of said second barrier layer (60); or the organic layer (2) of the first barrier layer (6) is applied on the surface of the inorganic layer (3) of said first barrier layer (6) and the inorganic layer (30) of the second barrier layer (60) is applied on the surface of the organic layer (20) of said second barrier layer (60); and wherein the organic layer is a polyvinyl alcohol layer, in particular an ethylene vinyl alcohol copolymer comprising between 25 to 50 mol % alcohol, preferably between 27 to 45 mol % of alcohol;
- the support layer(s) is (are) submitted to a compatibilisation treatment to enhance the compatibility between said one or more support layer(s) and said organic layer of the one or more barrier layer(s);
- the compatibilisation treatment is selected from a plasma treatment, a Corona treatment, a flame treatment, or a combination of one or more of these treatments.

A packaging comprising a flexible multilayer film according to the present invention is also disclosed.

SHORT DESCRIPTION OF THE DRAWINGS

Figure 1B:
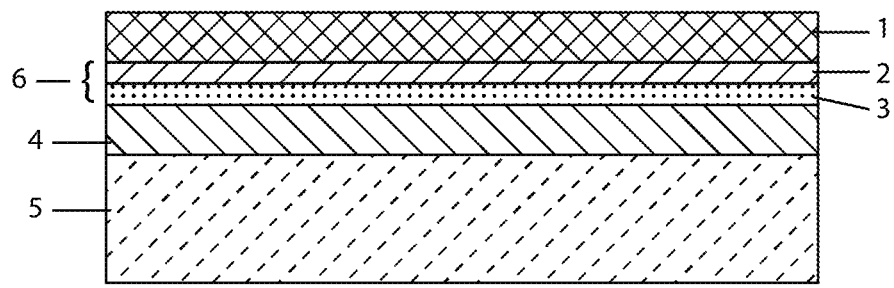
Figure 1C:
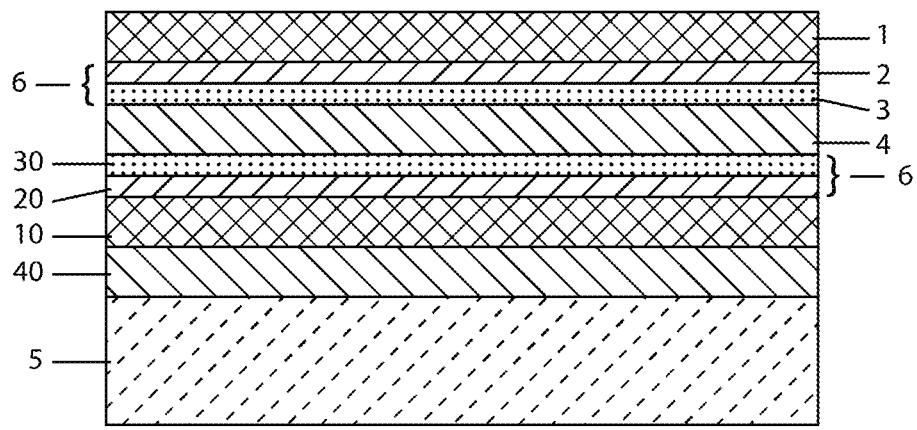

FIG. 1A to 1C schematically represent the progressive construction of a multi-layer film according to the invention.

Figure 2:
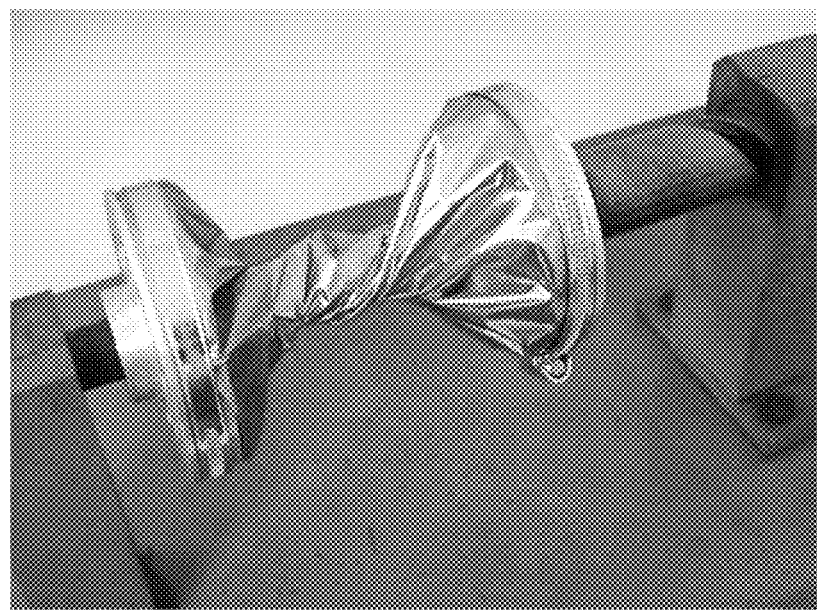

FIG. 2 represents a picture of a Gelbo Flex Tester designed to determine the flex resistance of flexible barrier materials by applying repetitive strain (i.e. twisting and horizontal motion).

Figure 3A:
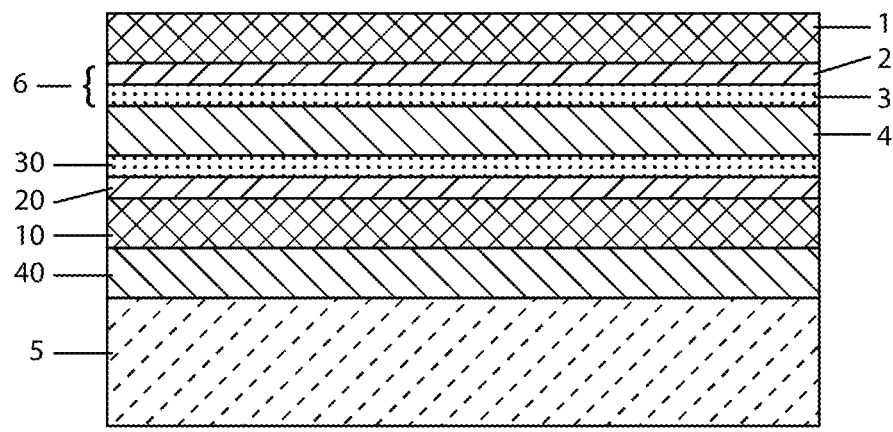
Figure 3B:
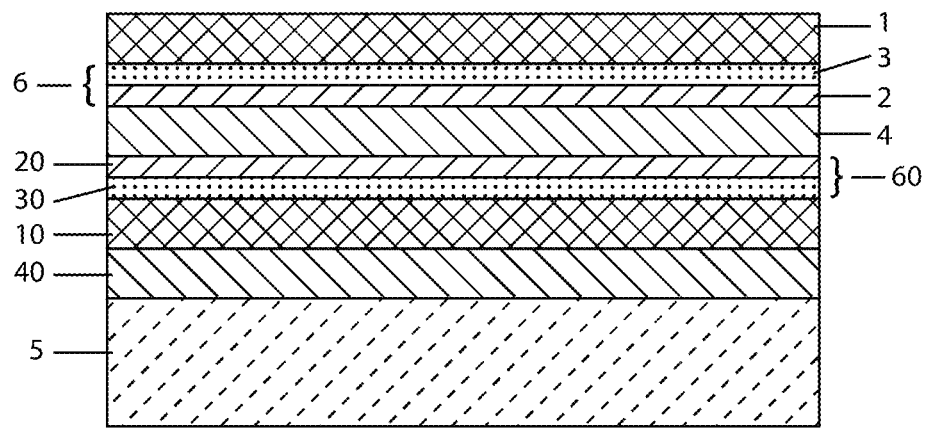
Figure 3C:
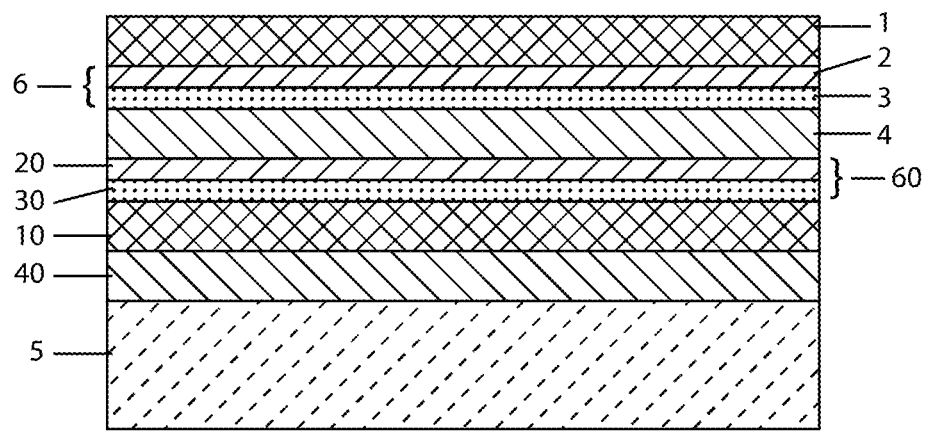

FIG. 3A to 3C schematically represent different sequences of the organic and inorganic layer of the barrier layers in flexible multilayer packaging films of the present invention.

DETAILED DESCRIPTION OF THE INVENTION

Laminate constructions in the art using barrier webs with transparent oxide coatings such as SiOx and AlOx can convey good oxygen and water barrier properties; typical barrier values of OTR 0.5 and WVTR 0.4 can be achieved, increasing the barrier of the base film by more than 100 times. However, upon flexing the laminate (simulated by Gelbo flexing) the barrier is compromised, resulting in a significantly reduced barrier performance.

Aluminium foils are known to offer exceptional barrier to oxygen and water; without pin-holes, it is generally not possible to measure barrier properties of multilayer structures containing more than 8 µm Aluminium foil. However, after flexing, barrier properties are significantly eroded by the generation of pin-holes through the foil resulting in oxygen transmission rates (OTR) of 0.5 $cm^3/m^2/24$ h/atm and water vapour transmission rates (WVTR) of 0.5 $g/m^2/24$ h/atm after 100 flexes.

EVOH and PVOH coatings are also known in the art to convey good oxygen barrier properties; these coatings are generally more resistant to flexing than oxide coatings and aluminium foils. However, barrier levels lower than 0.4 OTR cannot be readily achieved with EVOH and PVOH coatings alone. Moreover, the coatings do not enhance water barrier at all, and their water sensitivity diminishes their effectiveness in applications requiring oxygen barrier under humid conditions.

EVOH containing coextrusions such as PP//EVOH//PP with EVOH layers from 2 to 5 µm are widely used in packaging applications can offer good oxygen barrier and flex crack resistance. However, no water barrier is offered by the EVOH layer and barrier levels lower than 1 OTR are not readily achievable with this type of substrate unless much thicker EVOH layers are used.

According to an aspect of the invention, there is provided a flexible multilayer packaging film with high gas barrier properties, in particular, extremely, ultra-high barrier properties, as set out in the appended claims.

According to another aspect of the invention, there is provided a method for producing such flexible multilayer packaging film, as set out in the appended claims.

A flexible multilayer packaging film according to the present invention is schematically illustrated in FIGS. 1A to 1C, wherein (1) depicts a flexible substrate (or support layer); (2,20) the organic layer of the barrier layer (6,60); (3,30) the inorganic layer of the barrier layer (6,60); (4,40) an adhesive layer; and (5) a sealant layer.

Advantageously, the flexible multilayer packaging film of the present invention comprises one or more barrier layer(s) (6,60); advantageously one or two barrier layer(s) (6,60).

Advantageously, the thickness of the organic layer(s) (2,20) (of the barrier layer (6,60)) is comprised between 0.5 µm and 10 µm, advantageously between 0.8 µm and 5 µm, advantageously between 1 µm and 4 µm.

The barrier layer of a flexible multi-layer film of the invention always needs a (flexible) substrate (or support layer) which can be chosen among oriented films such as oPP (oriented polypropylene), oPA (oriented polyamide), oPLA (oriented polylactide polymer), oPET (oriented polyethyleneterephtalate), or oPS (oriented polystyrene), regenerated cellulose, Cellulose Diacetate, PVC (polyvinylchloride), PVdC (polyvinylidene chloride), as well as ECTFE (ethylene chlorotrifluoroethylene), ETFE (ethylene tetrafluroethylene), or PEI (polyetherimide).

Advantageously, the flexible multilayer packaging film of the present invention comprises one or more support layer(s) (1,10); advantageously one or two support layers (1,10).

Advantageously, the thickness of the support layer(s) (1,10) is comprised between 6 µm and 110 µm, advantageously between 8 µm and 100 µm, advantageously between 10 µm and 40 µm, advantageously between 12 µm and 20 µm; advantageously between 15 µm and 20 µm.

A layer of EVOH (ethylene vinyl alcohol) or PVOH (polyvinylalcohol) containing between (about) 25 to (about) 50 mol % OH, preferably between (about) 27 and (about) 45 mol % OH is applied as a coherent layer onto a flexible substrate.

More particularly, a layer of EVOH or PVOH is applied as a coherent layer onto a flexible substrate from solution, emulsion, or from a molten phase.

The layer of EVOH or PVOH can be applied onto the flexible substrate from an aqueous or solvent based solution, by a flexographic process. Alternatively, a smooth roll coater or direct rotogravure coating of EVOH or PVOH can equally be used.

The use of a primer or tie layer in order to anchor the EVOH or PVOH coating to the flexible substrate may be required depending on the adhesion of the coating onto the substrate.

A suitable primer layer for use in the present invention will be apparent for those skilled in the art.

Preferably, the primer layer is a polyurethane primer or a polyethylene imine primer.

On the layer of EVOH or PVOH, additionally a SiOx or AlOx ceramic layer can be applied.

Advantageously, the deposition of SiOx (or AlOx) onto the surface of the EVOH or PVOH layer is performed by means of electron beam vacuum deposition.

Preferably, the electron beam vacuum deposition is performed at a (reduced) pressure lower than $10^{-3}$ mbar with an applied voltage (to the electrons in the electron beam) of (about) 5 to (about) 40 kV.

EP 0 794 266 for example describes a method and device for coating a substrate surface with SiOx or AlOx by electron beam vacuum deposition, whereby the SiOx or AlOx is vaporized and deposited onto the surface of the substrate. The method and device described in EP 0 794 266 are incorporated herein by reference.

Alternatively, the deposition of SiOx (or AlOx) is directly performed on the surface of the flexible substrate layer and subsequently covered by the EVOH or PVOH layer. The EVOH or PVOH layer can be applied on the already deposited SiOx (or AlOx) layer by the use of an adhesive or by extrusion lamination.

In the context of the present invention, oxides of silicon are referred to as SiOx where x is a number from 1 to 2, preferably from 1.5 to 1.8 (i.e. SiOx in which $1 \leq x \leq 2$, preferably in which $1.5 \leq x \leq 1.8$).

In the context of the present invention, AlOx refers to oxides of aluminum having the formula $Al_yO_z$ where the ratio y/z is a number from 0.2 to 1.5. Preferably, y is 2 and z is 3 (i.e. $Al_2O_3$).

The resulting coating of the present invention is transparent (or optical clear).

The resulting coated barrier film can be further laminated to a (or one) sealant layer (or seal layer) by the use of an adhesive, extrusion lamination, or thermal lamination.

A suitable adhesive for use in the present invention will be apparent for those skilled in the art.

Preferably, the adhesive is a polyurethane (PU) adhesive (such as e.g. Adcote™ 811/9L10).

A suitable sealant layer (or seal layer) for use in the present invention will be apparent for those skilled in the art. For instance, a sealant layer used in the multilayer film of the present invention can be a pressure tacky adhesive, an adhesive, as well as a heat seal film such as PE or PP.

For example LLDPE (Linear low-density polyethylene) or PP (polypropylene) coextrusions, or PETG (Polyethylene terephthalate glycol-modified) seal webs, from (about) 150 μm down to (about) 10 μm thick, can be used as a sealant layer (or seal layer).

Multiple layers of the obtained barrier coated film can be added one to another by the use of an adhesive or by extrusion lamination, to further improve the barrier properties of the resulting flexible multilayer packaging film of the invention, as also illustrated in FIGS. 1A to 1C.

Existing barrier film solutions in the art are for example:
PET/SiOx/adh/PE laminates offering OTR of 0.5 to 1 and WVTR 0.3 to 1;
PET-EVOH/Adh/PE laminates offering OTR of 0.5 to 1 and WVTR of 1 to 2.

By applying the inverse rule of mixtures, it may theoretically be expected that the oxygen barrier achieves a value of OTR of 0.25 by combining EVOH and SiOx.

However, by actually applying SiOx onto the surface of the EVOH coating according to the present invention, barrier performances in a laminate of OTR of even less than 0.05 and as low as 0.01 $cm^3/m^2/24$ h/atm (at 23° C. and 50% R.H.) and WVTR of less than 0.2 and as low as 0.1 $g/m^2/24$ h/atm (at 38° C. and 90% R.H.) can be achieved.

Moreover, surprisingly, after Gelbo flexing the laminate these oxygen and water vapour barrier properties values are substantially maintained near their initial un-flexed values.

It has thus been found that the barrier properties of the coated barrier films of the present invention are excellent.

Conversely, the barrier properties of the existing PET-SiOx//PE or PET/Alu/PE laminates in the art are significantly degraded following the same level of flexing.

Furthermore, in the present invention it has been found that the adhesion of the SiOx onto the EVOH is excellent. When delaminating a PET-EVOH-SiOx/Adh/PE laminate, the failure mode is at the EVOH-film interface with a bond strength of more than 4N/15 mm (i.e. the EVOH loosens from the substrate), with no failure at the SiOx-EVOH interface (i.e. the EVOH does not loosen from the SiOx).

More particularly, in the present invention the adhesion of the SiOx onto the EVOH is substantially improved when compared to the adhesion between the constituting layers of the coated barrier films obtained by methods described in the art.

In the present invention, one or more additional support layer(s) (or reinforcing layer(s)) can be further added to the coated barrier layers of the film (or to the flexible multilayer packaging film).

Preferably, the one or more additional support layer(s) comprise (or consist of) oriented polypropylene, oriented polyester, oriented polyamide, oriented polylactic acid, as well as copolymers of those polymers, paper and carton.

Advantageously, the thickness of the additional support layer(s) is comprised between 10 μm and 110 μm, advantageously between 10 μm and 100 μm, advantageously between 12 μm and 40 μm, advantageously between 12 μm and 20 μm; advantageously between 15 μm and 20 μm.

In the present invention, a thin aluminium layer can be further added to the coated barrier layers of the film. The thickness of the thin aluminium layer is comprised between (about) 5 μm and (about) 50 μm, preferably between (about) 5 μm and (about) 25 μm, most preferably between (about) 5 μm and (about) 15 μm. Including such thin aluminium layer renders the coating of the invention opaque (instead of being transparent or optical clear). Although aluminium is known to be expensive, the barrier films of the invention incorporating such thin aluminium layer are still less expensive compared to the films known in the art including thicker and/or more aluminium layers.

EXAMPLES

In each of the examples described below of flexible multilayer packaging films, the following values are measured:

(a) the oxygen gas transmission rates (OTR) of a laminate of the multilayer film according to the ASTM 3985-2005 standard, at 23° C. and 50% relative humidity (i.e. before Gelbo flexing), (b) the water vapour transmission rates (WVTR) of a laminate of the multilayer film according to the ASTM 1249-90 standard, at 38° C. and 90% relative humidity (i.e. before Gelbo flexing), (c) the OTR of a laminate of the multilayer film according to the ASTM 3985-2005 standard, at 23° C. and 50% relative humidity, after 10 times (or 100 times) Gelbo flexing the laminate according to the ASTM F392-74 standard;

(d) the WVTR of a laminate of the multilayer film according to the ASTM 1249-90 standard, at 38° C. and 90% relative humidity, after 10 times (or 100 times) Gelbo flexing the laminate according to the ASTM F392-74 standard.

MOCON® OX-TRAN® Model 2/21 is an example of an OTR testing system for high barrier testing.

The flexing of the laminate of flexible multilayer packaging films is performed using a Gelbo Flex Tester as illustrated in FIG. 2. Using the Gelbo Flex Tester determines the flex resistance of the flexible barrier materials by applying repetitive strain. The flexing action consists of a twisting motion combined with a horizontal motion, repeatedly twisting and crushing the film. Pin hole formation is the criteria for failure and pin holes are determined by use of colored turpentine by allowing it to stain through the pin holes onto a white backing.

An overview of the results of the measurements is given in Table 1.

In examples 1, 2, 4, and 6, commercially available flexible multilayer packaging films were analysed as comparative examples.

Suitable commercially available flexible multilayer packaging films will be apparent for those skilled in the art.

In example 2, for instance, a JBF A400 polyester film is used. In example 4, SiOx is coated onto a standard 20 μm OPP.

The test materials in examples 3 and 5 are prepared according to the invention.

The flexible multilayer packaging film PET-EVOH-SiOx//PE of the invention in example 3 is prepared as follows:
12 μm PET/2.5 μm PU Adhesive/60 μm PE is provided;
1.5 μm EVOH is applied onto the PET substrate from a flexographic process;
60 nm SiOx is applied onto the surface of the EVOH by electron beam vacuum deposition (EB coating);

the used adhesive in the laminate is a 2K solvent based PU adhesive applied from a forward gravure process;
PE is an A/B/C LLDPE coextrusion with a Dow AFFINITY® PL1880 metallocene seal layer.

The flexible multilayer packaging film OPP-EVOH-SiOx/Adh/PE according to the invention in example 5 is prepared as follows:

20 µm OPP/2.5 µm PU Adhesive/60 µm PE is provided;
1.5 µm EVOH is applied onto the OPP substrate from a flexographic process;
60 nm SiOx is applied onto the surface of the EVOH by electron beam vacuum deposition (EB coating);
the used adhesive in the laminate is a 2K solvent based PU adhesive applied from a forward gravure process;
PE is an A/B/C LLDPE coextrusion with a Dow AFFINITY® PL1880 metallocene seal layer.

From the present description and the examples, other flexible multilayer packaging films according to the invention will be apparent for those skilled in the art.

TABLE 1 measured OTR and WVTR values before and after 10 times/100 times Gelbo flexing

| Ex. | | OTR cm$^3$/m$^2$/day/atm 23° C. 50% RH | WVTR g/m$^2$/day 38° C. 90% RH | OTR 10 Gelbo | WVTR 10 Gelbo | OTR 100 Gelbo | WVTR 100 Gelbo |
|---|---|---|---|---|---|---|---|
| 1 | PET-EVOH/adh/PE | 0.5 | 2 | 0.6 | 2 | | |
| 2 | PET-SiOx/adh/PE | 0.5 | 0.4 | 4 | 0.6 | | |
| 3 | PET-EVOH-SiOx//PE | 0.01 | 0.12 | 0.01 | 0.15 | 0.1 | 0.16 |
| 4 | OPP-SiOx//PE | 4 | 0.2 | 13.2 | 0.5 | | |
| 5 | OPP-EVOH-SiOx/adh/PE | 0.1 | 0.1 | 0.19 | | | |
| 6 | PET/Alu8/70PE | <0.01 | <0.01 | 0.01 | 0.01 | 0.35 | 0.03 |

From the comparative examples 1, 2, 4, and 6, either without EVOH or without SiOx, it can be seen that the deterioration properties after Gelbo flexing are significant, and that the coated barrier film does not show good barrier properties.

The data for the flexible multilayer packaging films prepared according to the invention in examples 3 and 5 show that the barrier properties are good to excellent, even after being subjected to Gelbo flexing.

The barrier properties of the coated barrier films of the present invention are even substantially improved when compared to the barrier properties of the coated barrier films available (or obtained by methods described) in the art.

Without being bound to theory, the excellent barrier properties of the coated barrier film of the present invention could be due to the fact that in the present invention a flat, smooth surface of the laminate is achieved, said surface having substantially no defects (when compared to films obtained by methods described in the art). The EVOH can be considered as a planarization layer for the SiOx, thus reducing defects in the SiOx coating. It is believed that this planarization coating is beneficial for the barrier properties of the flexible multilayer packaging films according to the present invention.

For example, the (arithmetic average of the) three-dimensional surface roughness (denoted as Sa) of the SiOx receptive layer for conventional PET films used for SiOx coating, such as JBF A400 polyester film, Hostaphan® RNK (Mitsubishi Polyester Film GmbH) or Mylar® 800 (DuPont Teijin Films™), has been measured at 0.15 µm to 0.2 µm, as measured by Laser Scanning Microscopy (LSM) described in ISO 25178. However, EVOH coated films (such as those used in Examples 3 and 5) have an Sa-value of less than 0.1 µm, less than 0.05 µm, and even less than 0.03 µm.

Different sequences of the organic layer and inorganic layer of the barrier layers in flexible multilayer packaging films of the present invention are schematically illustrated in FIGS. 3A to 3C. In these figures, (1,10) depicts a flexible substrate (or support layer); (2,20) the organic layer of the barrier layer (6,60); (3,30) the inorganic layer of the barrier layer (6,60); (4,40) an adhesive layer; and (5) a sealant layer.

From the description and examples above, it follows that the present invention thus provides a flexible multilayer packaging film with high barrier properties, in particular, extremely, ultra-high barrier properties exhibiting oxygen transmission rates lower than 0.05, preferably lower than 0.01 cm$^3$/m$^2$/24 h/atm at 23° C. and 50% relative humidity.

The present invention further provides ultra-high barrier films against oxygen transmission, the films being able to maintain their properties even after submission of a laminate of the film to mechanical constraints such as folding or flexing, in particular, after submission to a normalised Gelbo flex test.

The flexible multilayer packaging films of the invention are aluminium-free (or even metal free), or at least comprising only strongly reduced aluminium (or metal) layer thicknesses, when compared to packaging films obtained by methods described in the art.

The present invention provides a method for producing such flexible multilayer packaging films having high barrier properties, in particular extremely, ultra-high barrier properties.

The film of the present invention can be used in flexible multilayer packaging for many food and non-food applications in packaging industry, more particularly, for those applications where high oxygen barrier properties, in particular, extremely ultra-high oxygen barrier properties are required.

The invention claimed is:

1. Flexible multilayer packaging film with high gas barrier properties comprising:
   one or more support layer(s) (1,10);
   one or more barrier layer(s) (6,60), each of the one or more barrier layer(s) (6,60) comprising an organic layer (2,20) and an inorganic layer (3,30);
   wherein the one or more support layer(s) is (are) selected from the group consisting of oriented polypropylene, as well as oriented polypropylene copolymers, oriented polyester, oriented polyamide, oriented polylactic acid, as well as oriented copolymers of polyester, polyaminde, and polylactic acid, paper and carton; the organic layer of the one or more barrier layer(s) is polyvinyl alcohol or ethylene vinyl alcohol copolymer comprising between 25 to 50 mol % alcohol; the inorganic layer of the one or more barrier layer(s) is AlOx or SiOx;

wherein the x in SiOx is comprised between 1 and 2, and wherein AlOx has the formula $Al_2O_3$;

wherein the organic layer is applied on the one or more support layer(s), and the AlOx or SiOx is applied on the organic layer;

wherein the one or more barrier layer(s) is (are) sandwiched between an additional sealant layer (5) and the one or more support layer(s);

wherein a laminate of said multilayer film has an oxygen transmission rate of less than 0.1 $cm^3/m^2/24$ h/atm, measured at 23° C. and 50% relative humidity.

2. Flexible multilayer packaging film according to claim 1, wherein the oxygen transmission rate of a laminate of said multilayer film does not increase more than 30%, after having been submitted to a Gelbo Flex mechanical constraint test according to ASTM F392-74 standard.

3. Flexible multilayer packaging film according to claim 1, wherein the organic layer of the one or more barrier layer(s) is polyvinyl alcohol or ethylene vinyl alcohol copolymer comprising between 27 to 45 mol % of alcohol.

4. Flexible multilayer packaging film according to claim 1, wherein the sealant layer has a thickness of at least 10 μm and is selected from the group consisting of polyethylene, polypropylene, polyethylene and polypropylene copolymers, and amorphous polyester.

5. Flexible multilayer packaging film according to claim 1, wherein the inorganic layer of the one or more barrier layer(s) is SiOx.

6. Flexible multilayer packaging film according to claim 1, wherein the inorganic layer has a thickness between 20 and 120 nm.

7. Flexible multilayer packaging film according to claim 1, wherein the one or more barrier layer(s) further comprise(s) an aluminium layer having a thickness comprised between 5 μm and 50 μm.

8. Method for the production of the flexible multilayer packaging film according to claim 1 comprising the steps of:
   providing one or more support layer(s) (1,10);
   applying the organic layer (2,20) of the one or more barrier layer(s) (6,60) on the one or more support layer(s) (1,10);
   applying the inorganic layer (3,30) of the one or more barrier layer(s) (6,60) on the surface of the organic layer (2,20) of the one or more barrier layer(s) (6,60);
   applying an additional sealant layer (5) on the one or more applied barrier layer(s) (6,60).

9. Method according to claim 8, wherein the inorganic layer is applied by electron beam vacuum deposition.

10. Method according to any of claim 8, wherein the inorganic layer is applied by electron beam vacuum deposition at a pressure lower than $10^{-3}$ mbar with an applied voltage of 5 to 40 kV.

11. Method according to claim 8, wherein the organic layer is a polyvinyl alcohol layer or an ethylene vinyl alcohol copolymer layer comprising between 25 to 50 mol % alcohol.

12. Method according to claim 8, wherein the support layer(s) is (are) submitted to a compatibilisation treatment to enhance the compatibility between said one or more support layer(s) and said organic layer of the one or more barrier layer(s).

13. Method according to claim 12, wherein the compatibilisation treatment is selected from a plasma treatment, a Corona treatment, a flame treatment, or a combination of one or more of these treatments.

14. Packaging comprising a flexible multilayer film according to claim 1.

15. Flexible multilayer packaging according to claim 1 wherein the oxygen transmission rate is less than 0.05 $cm^3/m^2/24$ h/atm.

16. Flexible multilayer packaging according to claim 1 wherein the oxygen transmission rate is less than 0.03 $cm^3/m^2/24$ h/atm.

17. Flexible multilayer packaging film according to claim 2, wherein the oxygen transmission rate of a laminate of said multilayer film does not increase more than 20%, after having been submitted to a Gelbo mechanical constraint test according to ASTM F392-74 standard.

18. Flexible multilayer packaging film according to claim 2, wherein the oxygen transmission rate of a laminate of said multilayer film does not increase more than 10%, after having been submitted to a Gelbo mechanical constraint test according to ASTM F392-74 standard.

19. Flexible multilayer packaging film according to claim 1, wherein the x in SiOx is comprised between 1.5 and 1.8.

20. Flexible multilayer packaging film according to claim 6, wherein the thickness is between 30 and 100 nm.

21. Flexible multilayer packaging film according to claim 6, wherein the thickness is between 40 and 80 nm.

22. Flexible multilayer packaging film according to claim 7, wherein the thickness comprised between 5 μm and 25 μm.

23. Flexible multilayer packaging film according to claim 7, wherein the thickness comprised between 5 μm and 15 μm.

24. Method according to claim 8, wherein the organic layer is a polyvinyl alcohol layer or an ethylene vinyl alcohol copolymer layer comprising between 27 to 45 mol % alcohol.

* * * * *

UNITED STATES PATENT AND TRADEMARK OFFICE
CERTIFICATE OF CORRECTION

PATENT NO. : 10,549,510 B2
APPLICATION NO. : 15/737947
DATED : February 4, 2020
INVENTOR(S) : Peter Ettridge et al.

It is certified that error appears in the above-identified patent and that said Letters Patent is hereby corrected as shown below:

On the Title Page

Item (72) Inventors: delete "Steffan" and insert -- Steffen --;

In the Specification

Column 1, Line 18: delete "imitative" and insert -- limitative --;
Column 10, Line 65-66: delete "polyaminde" and insert -- polyamide --;

In the Claims

Claim 10, Column 12, Line 1: after "according to" delete "any of";
Claim 10, Column 12, Line 13: delete "$10^{31\ 3}$" and insert -- $10^{-3}$ --.

Signed and Sealed this
Nineteenth Day of November, 2024

*Katherine Kelly Vidal*
*Director of the United States Patent and Trademark Office*